(12) United States Patent
Chan et al.

(10) Patent No.: US 9,312,380 B2
(45) Date of Patent: Apr. 12, 2016

(54) SEMICONDUCTOR DEVICE HAVING DEEP IMPLANTATION REGION AND METHOD OF FABRICATING SAME

(71) Applicant: Macronix International Co., Ltd., Hsinchu (TW)

(72) Inventors: Ching-Lin Chan, Huwei Township (TW); Cheng-Chi Lin, Toucheng Township (TW); Shih-Chin Lien, Sinjhuang (TW); Shyi-Yuan Wu, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 103 days.

(21) Appl. No.: 14/219,972

(22) Filed: Mar. 19, 2014

(65) Prior Publication Data

US 2015/0270388 A1    Sep. 24, 2015

(51) Int. Cl.
*H01L 29/66* (2006.01)
*H01L 29/78* (2006.01)
*H01L 29/08* (2006.01)
*H01L 29/10* (2006.01)

(52) U.S. Cl.
CPC ........ *H01L 29/7816* (2013.01); *H01L 29/0865* (2013.01); *H01L 29/0878* (2013.01); *H01L 29/1095* (2013.01); *H01L 29/66659* (2013.01); *H01L 29/66696* (2013.01); *H01L 29/7835* (2013.01)

(58) Field of Classification Search
USPC ........................................................ 257/343
See application file for complete search history.

(56) References Cited

U.S. PATENT DOCUMENTS

| 2006/0057784 | A1* | 3/2006 | Cai et al. | H01L 29/7835 438/149 |
| 2010/0140700 | A1* | 6/2010 | Lee | H01L 29/0634 257/343 |
| 2011/0140201 | A1* | 6/2011 | Lin et al. | H01L 29/0634 257/342 |
| 2012/0104492 | A1* | 5/2012 | Chu | H01L 29/0634 257/335 |
| 2012/0241861 | A1* | 9/2012 | Chen | H01L 29/0634 257/339 |
| 2012/0267715 | A1* | 10/2012 | Chou et al. | H01L 29/1045 257/336 |
| 2012/0280316 | A1* | 11/2012 | Lin | H01L 29/66689 257/335 |
| 2012/0292740 | A1* | 11/2012 | Lin | H01L 28/20 257/536 |

FOREIGN PATENT DOCUMENTS

| TW | 201240085 A1 | 10/2012 |
| TW | 201240086 A1 | 10/2012 |

\* cited by examiner

*Primary Examiner* — Allen Parker
*Assistant Examiner* — Ismail Muse
(74) *Attorney, Agent, or Firm* — Finnegan, Henderson, Farabow, Garrett & Dunner LLP

(57) ABSTRACT

A semiconductor device includes a substrate having a first conductivity type, a high-voltage well having a second conductivity type and disposed in the substrate, a source well having the first conductivity type and disposed in the high-voltage well, a drift region disposed in the high-voltage well and spaced apart from the source well, and a deep implantation region having the first conductivity type and disposed in the high-voltage well between the source well and the drift region.

17 Claims, 17 Drawing Sheets

SEMICONDUCTOR DEVICE HAVING DEEP IMPLANTATION REGION AND METHOD OF FABRICATING SAME

FIELD OF THE DISCLOSURE

The present disclosure relates to a semiconductor device and a method of fabricating the same and, more particularly, to a semiconductor device having a deep implantation region and a method of fabricating the same.

BACKGROUND OF THE DISCLOSURE

A lateral drain metal-oxide-semiconductor (LDMOS) device is a high voltage device widely used in display devices, portable devices, and many other applications. Design goals of the LDMOS device include a high breakdown voltage and a low specific on-resistance.

The specific on-resistance of the LDMOS device is limited by a doping concentration of a grade region of the device. When the doping concentration of the grade region decreases, the specific on-resistance increases.

SUMMARY

According to an embodiment of the disclosure, a semiconductor device includes a substrate having a first conductivity type, a high-voltage well having a second conductivity type and disposed in the substrate, a source well having the first conductivity type and disposed in the high-voltage well, a drift region disposed in the high-voltage well and spaced apart from the source well, and a deep implantation region having the first conductivity type and disposed in the high-voltage well between the source well and the drift region.

According to another embodiment of the disclosure, a method for fabricating a semiconductor device includes providing a substrate having a first conductivity type, forming a high-voltage well having a second conductivity type in the substrate, forming a source well having the first conductivity type in the high-voltage well, forming a drift region in the high-voltage well and spaced apart from the source well, and forming a deep implantation region having the first conductivity type in the high-voltage well and between the source well and the drift region.

DETAILED DESCRIPTION

Reference will now be made in detail to the present embodiments, examples of which are illustrated in the accompanying drawings. Wherever possible, the same reference numbers will be used throughout the drawings to refer to the same or like parts.

Figure 1A:
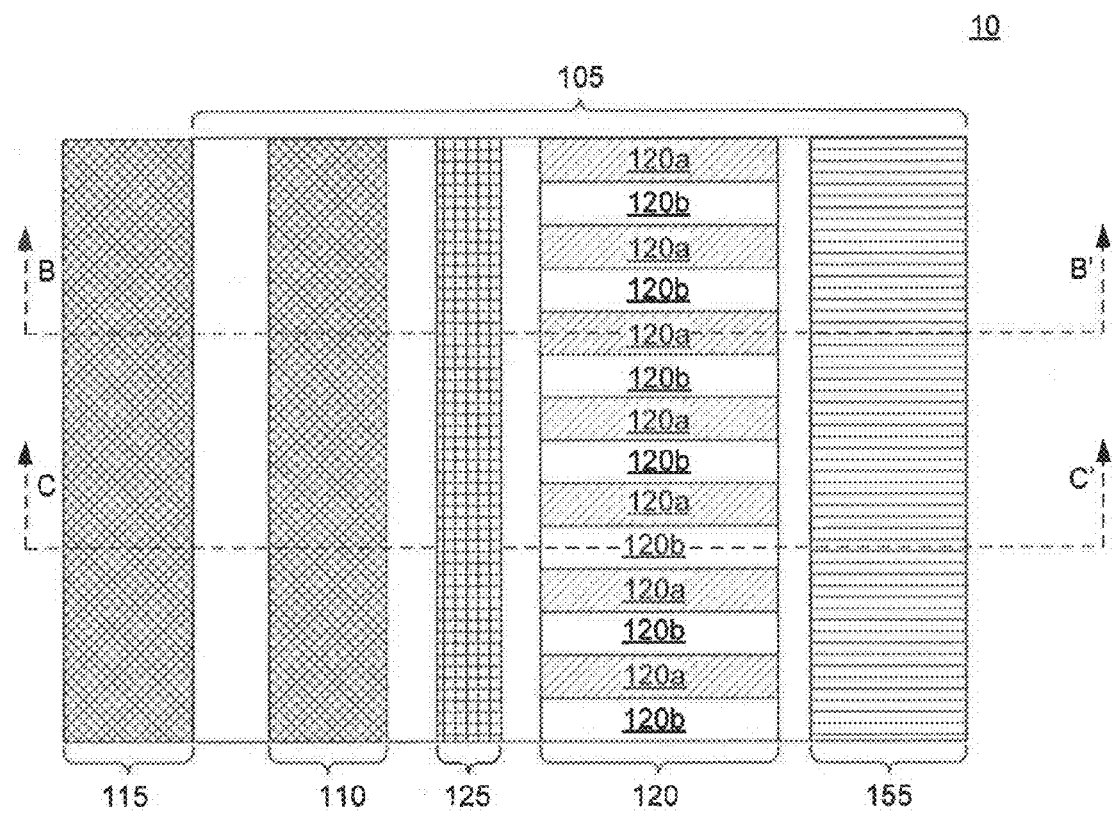
FIG. 1A is a top view of a LDMOS device according to an embodiment.
Figure 1B:
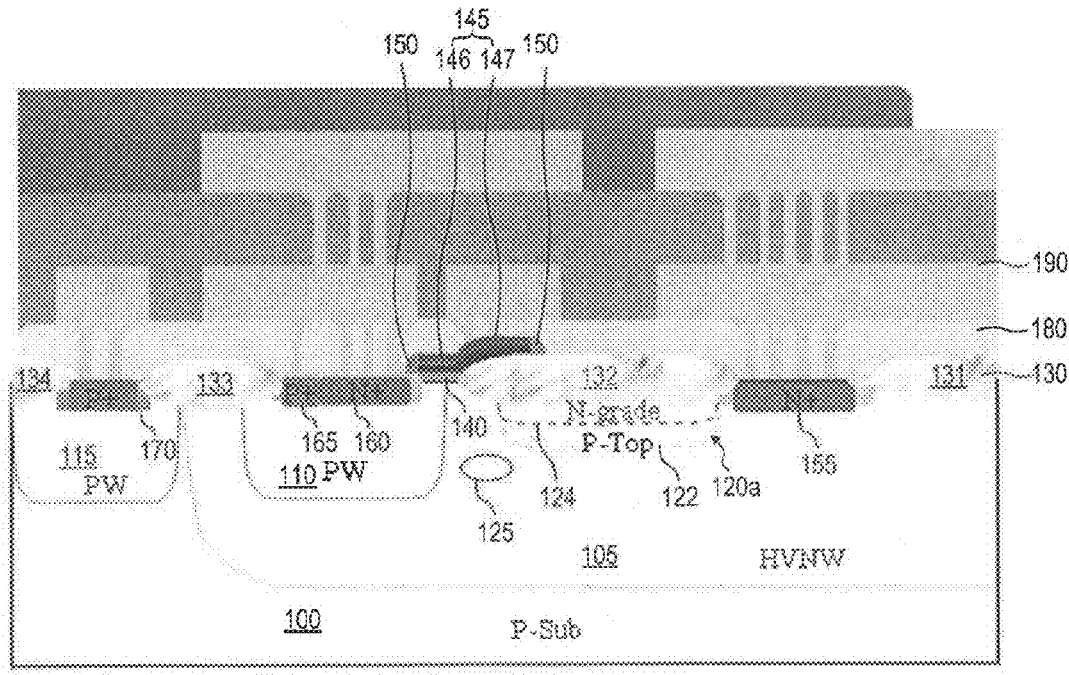
FIG. 1B is a cross-sectional view of the LDMOS device along line B-B' of FIG. 1A.
Figure 1C:
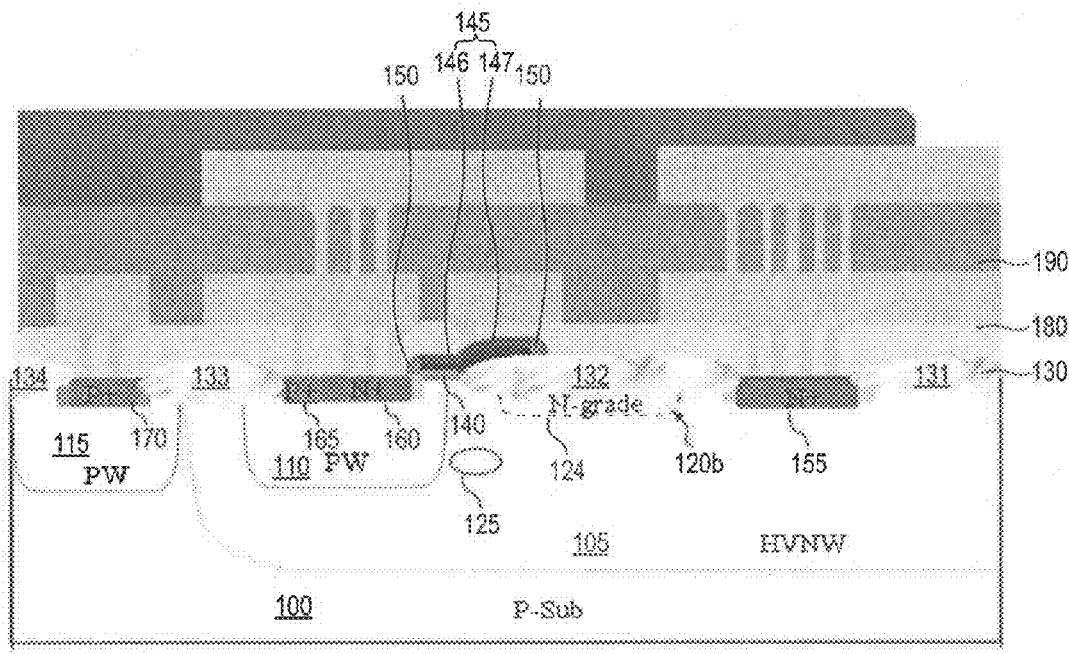
FIG. 1C is a cross-sectional view of the LDMOS device along line C-C' of FIG. 1A.

FIG. 1A schematically illustrates a top view of a LDMOS device 10 according to an embodiment. FIG. 1B is a cross-sectional view of LDMOS device 10 along line B-B' of FIG. 1A. FIG. 1C is a cross-sectional view of LDMOS device 10 along line C-C' of FIG. 1A.

As illustrated in FIGS. 1A-1C, LDMOS device 10 includes a P-type substrate 100, a high-voltage N-well (HVNW) 105 formed in substrate 100, a first P-well 110 formed in HVNW 105, a second P-well 115 formed outside and adjacent to HVNW 105, a drift region 120 formed in HVNW 105 on a side (e.g., right-side) of and spaced apart from first P-well 110, a P-type deep implantation region 125 formed in HVNW 105 between first P-well 110 and drift region 120, and an insulation layer 130 disposed on substrate 100. Drift region 120 includes a plurality of alternately arranged first sections 120a and second sections 120b. Each first section 120a includes a P-top region 122 and an N-grade region 124 disposed on P-top region 122. Each second section 120b includes N-grade region 124. Insulation layer 130 can be made of field oxide (FOX). Hereinafter, insulation layer 130 is referred to as FOX layer 130. FOX layer 130 includes a first FOX portion 131 spaced apart from drift region 120, a second FOX portion 132 covering drift region 120, a third FOX portion 133 covering a portion of HVNW 105 between first P-well 110 and second P-well 115, and a fourth FOX portion 134 covering a side (e.g., left-side) edge portion of second P-well 115.

LDMOS device 10 also includes a gate oxide layer 140 disposed on substrate 100 between the side (i.e., right-side) edge portion of first P-well 110 and a side (e.g., left-side) edge portion of second FOX portion 132, a gate layer 145 disposed on gate oxide layer 140, spacers 150 disposed on side walls of gate layer 145, a first $N^+$-region 155 formed in HVNW 105 between first FOX portion 131 and second FOX portion 132, a second $N^+$-region 160 formed in first P-well 110 adjacent to a side (e.g., left-side) edge portion of gate layer 145, a first $P^+$-region 165 formed in first P-well 110 adjacent to second $N^+$-region 160, and a second $P^+$-region 170 formed in second P-well 115 between third FOX portion 133 and fourth FOX portion 134. Gate layer 145 includes a polysilicon layer 146 and a tungsten silicide layer 147 formed on polysilicon layer 146. First $N^+$-region 155 constitutes a drain region of LDMOS device 10. Second $N^+$-region 160 and first $P^+$-region 165 constitute a source region of LDMOS device 10. Second $P^+$-region 170 constitutes a bulk region of LDMOS device 10. First P-well 110 constitutes a source well of LDMOS device 10. Second P-well 115 constitutes a bulk well of LDMOS device 10.

LDMOS device 10 further includes an interlayer dielectric (ILD) layer 180 formed on substrate 100, and a contact layer 190 formed on ILD layer 180. Contact layer 190 includes a plurality of isolated contact portions for conductively contacting different portions of the structures formed in substrate 100 via different openings formed in ILD layer 180.

In LDMOS device 10 according to the embodiment, P-type deep implantation region 125 is formed in the region between first P-well 110 and drift region 120, to assist in formation of a full depletion region. As a result, a doping concentration in P-top region 122 can be decreased, or a doping concentration in N-grade region 124 can be increased, which has the effect of reducing the specific on-resistance of LDMOS device 10.

Figure 2A:
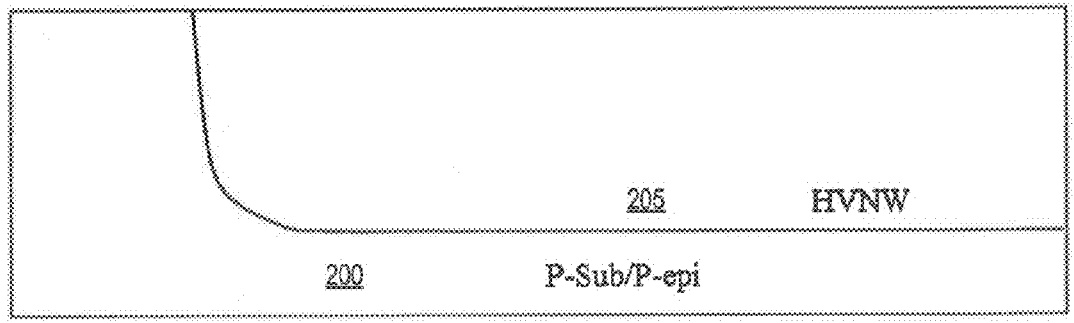
FIGS. 2A-14B schematically illustrate a process of fabricating the LDMOS device of FIGS. 1A-1C, according to an embodiment.
Figure 2B:
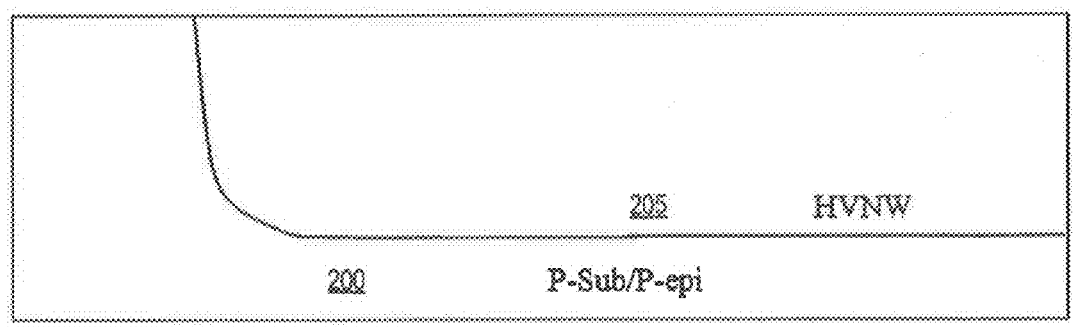
Figure 3A:
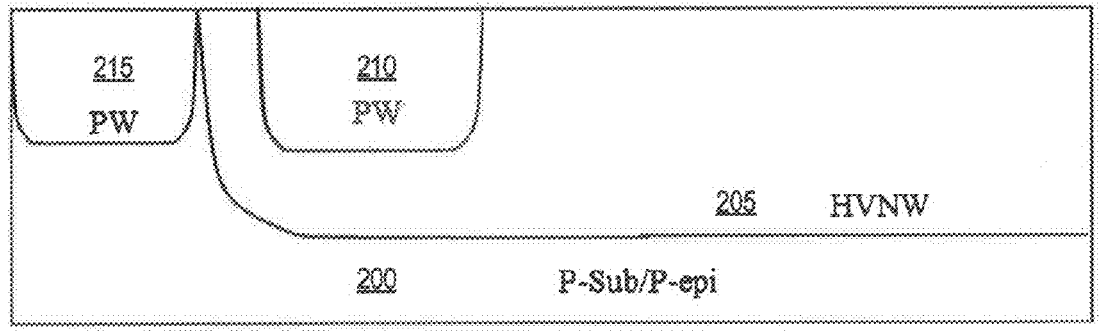
Figure 3B:
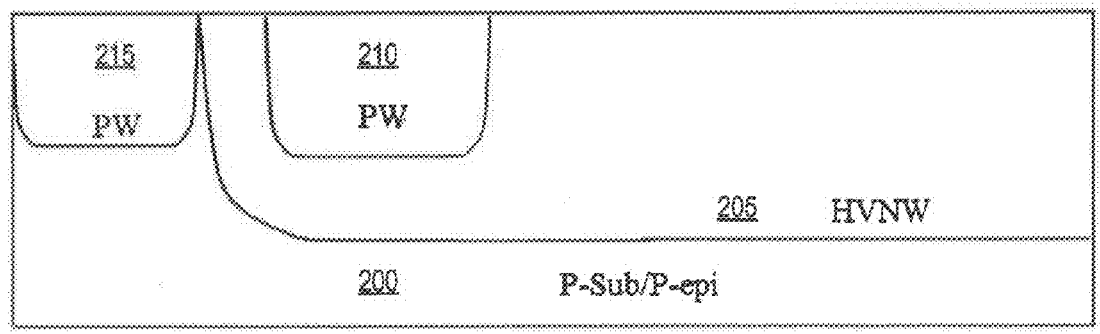
Figure 4A:
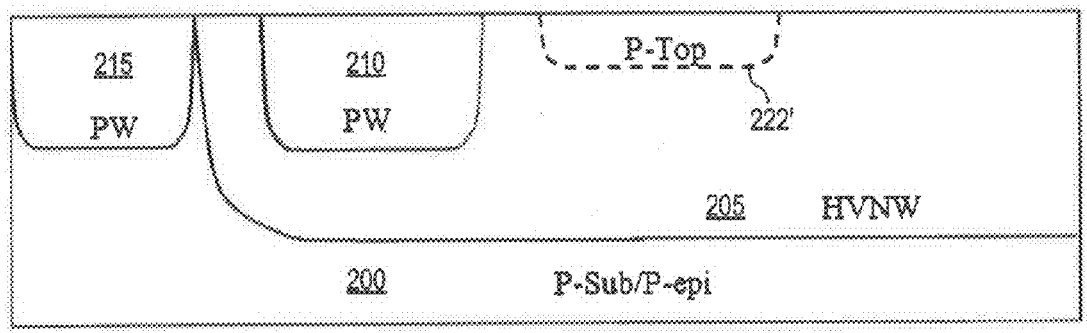
Figure 4B:
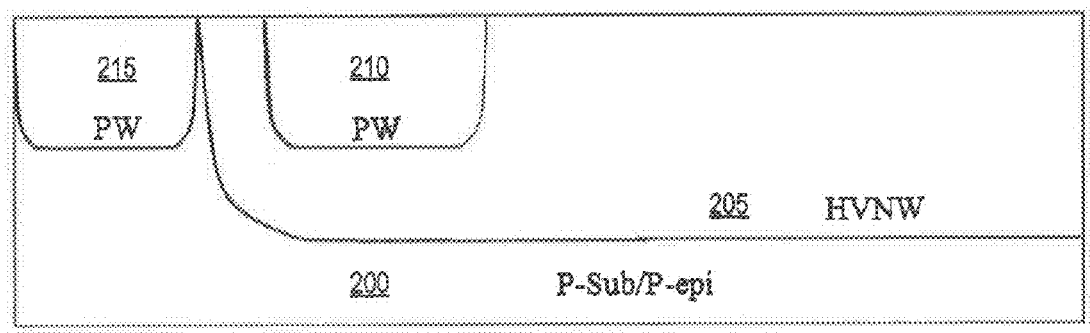

FIGS. 2A-14B schematically illustrate a process of fabricating LDMOS device 10 of FIGS. 1A-1C, according to an embodiment. FIGS. 2A, 3A, 4A, . . . , 14A schematically illustrate partial cross-sectional views of LDMOS device 10 taken along line B-B' of FIG. 1A during steps of the process of fabricating LDMOS device 10. FIGS. 2B, 3B, 4B, ..., 14B schematically illustrate partial cross-sectional views of LDMOS device 10 taken along line C-C' of FIG. 1A during steps of the process of fabricating LDMOS device 10.

First, referring to FIGS. 2A and 2B, a substrate 200 having a first conductivity type is provided, and a deep well 205 having a second conductivity type is formed in substrate 200 and extends downward from a top surface of substrate 200. In the illustrated embodiment, the first conductivity type is P-type, and the second conductivity type is N-type. Hereinafter, deep well 205 is referred to as a high-voltage N-well (HVNW) 205. Substrate 200 can be formed of a P-type bulk silicon material, a P-type epitaxial layer, or a P-type silicon-on-insulator (SOI) material. HVNW 205 can be formed by a photolithography process that defines a region in which HVNW 205 is to be formed, an ion implantation process for implanting an N-type dopant (e.g., phosphorus or arsenic) at a concentration of about $10^{11}$ to $10^{13}$ atoms/cm$^2$ in the defined region, and a heating process for driving-in the implanted dopant to reach a predetermined depth.

Referring to FIGS. 3A and 3B, a first P-well 210 is formed in HVNW 205, close to an edge portion of HVNW 205. A second P-well 215 is formed in substrate 200, outside and adjacent to the edge portion of HVNW 205. First P-well 210 and second P-well 215 can be formed by a photolithography process that defines regions in which first P-well 210 and second P-well 215 are to be formed, an ion implantation process for implanting a P-type dopant (e.g., boron) at a concentration of about $10^{12}$ to $10^{14}$ atoms/cm$^2$ in the defined regions, and a heating process for driving-in the implanted dopant to reach a predetermined depth.

Referring to FIGS. 4A and 4B, a P-top implantation region 222' is formed in HVNW 205, in regions corresponding to first sections 120a illustrated in FIG. 1A. No P-top implantation region 222' is formed in regions corresponding to second sections 120b illustrated in FIG. 1A. P-top implantation region 222' can be formed by a photolithography process for defining first sections 120a, and an ion implantation process for implanting a P-type dopant (e.g., boron) into first sections 120a at a concentration of about $10^{11}$ to $10^{14}$ atoms/cm$^2$.

Figure 5A:
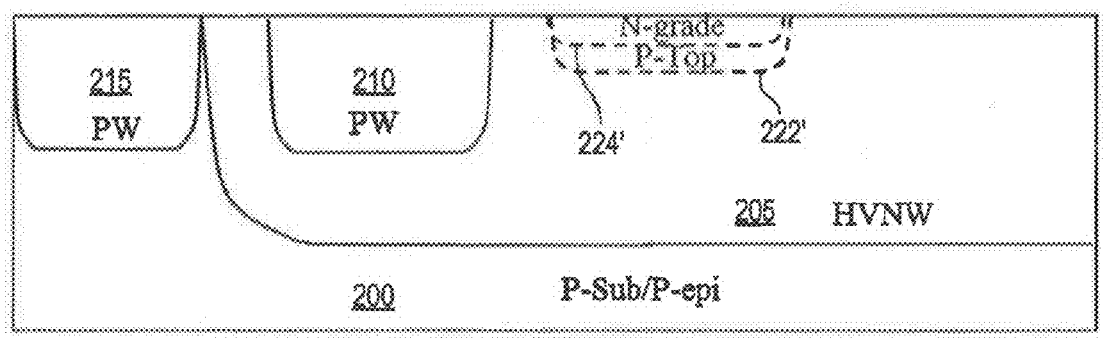
Figure 5B:
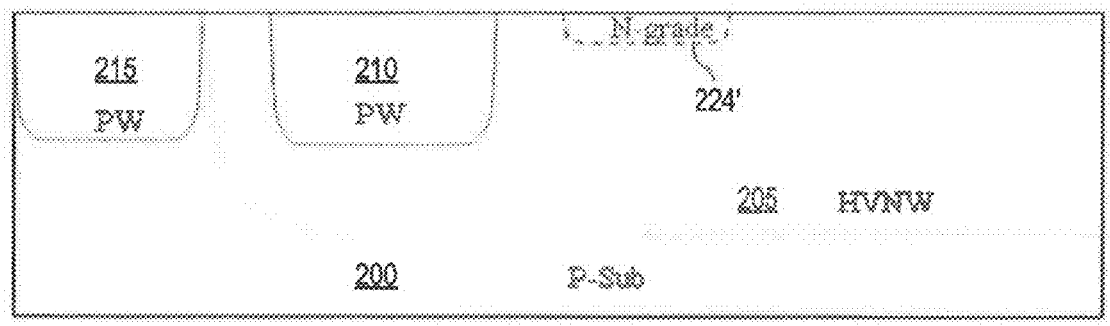

Referring to FIGS. 5A and 53, an N-grade implantation region 224' is formed in HVNW 205, in regions corresponding to both first section 120a and second section 120b illustrated in FIG. 1A. N-grade implantation region 224' can be formed by a photolithography process that defines first sections 120a and second sections 120b, and an ion implantation process for implanting an N-type dopant (e.g., phosphorus or arsenic) at a concentration of about $10^{11}$ to $10^{14}$ atoms/cm$^2$ in first sections 120a and second sections 120b.

Figure 6A:
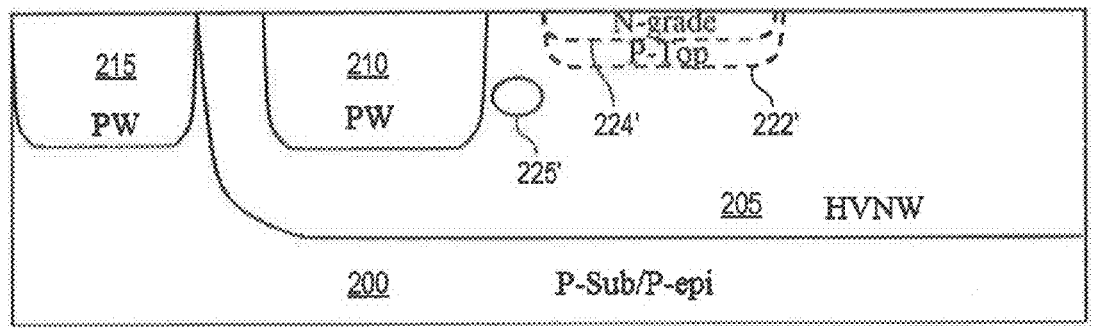
Figure 6B:
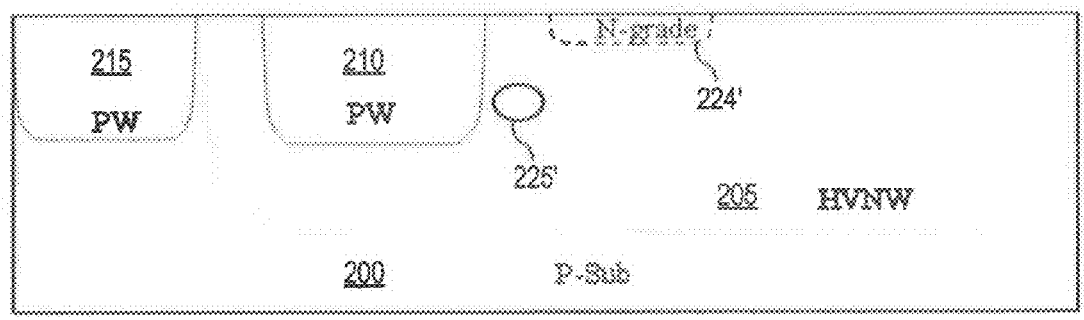

Referring to FIGS. 6A and 63, a P-type implantation region 225' is formed in HVNW 205, close to a right-side edge of first P-well 210. P-type implantation region 225' can be formed by a photolithography process that defines a region in which P-type implantation region 225' is to be formed, and an ion implantation process for implanting a P-type dopant (e.g., boron) at a concentration of about $10^{12}$ to $10^{14}$ atoms/cm$^2$ in the defined region. An implantation energy for the ion implantation process for forming P-type implantation region 225' is greater than an implantation energy for the ion implantation process for forming P-top implantation region 222' and an implantation energy for the ion implantation process for forming N-grade implantation region 224'.

Figure 7A:
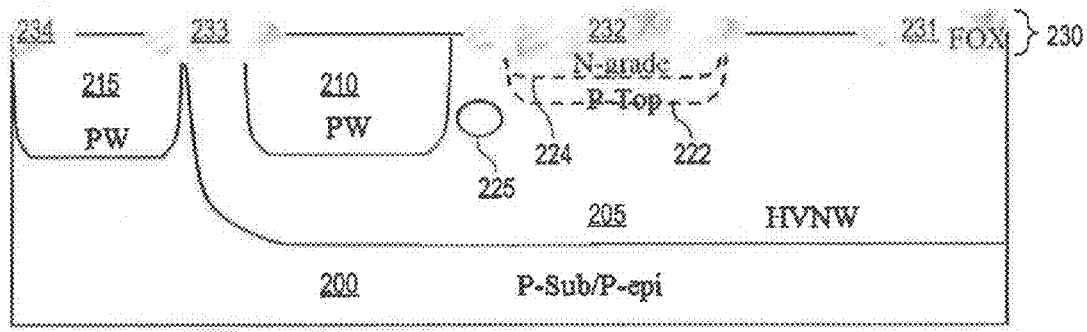
Figure 7B:
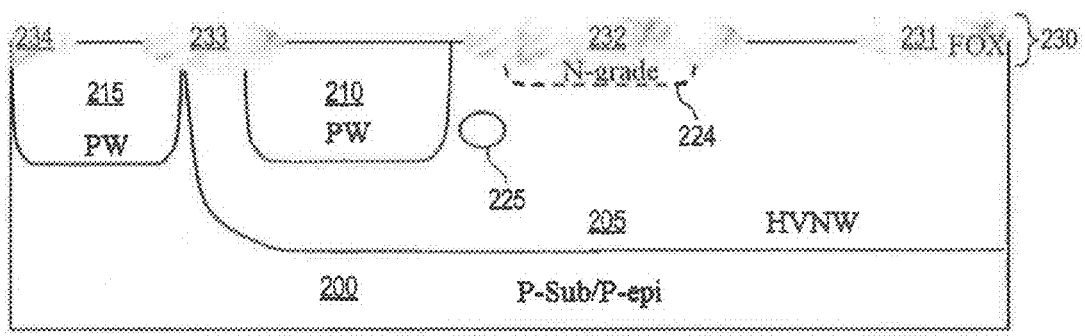

Referring to FIGS. 7A and 7B, an insulation layer in the form of a field oxide (FOX) layer 230 is formed on the top surface of substrate 200. FOX layer 230 includes a first FOX portion 231 covering a right edge portion of HVNW 205, a second FOX portion 232 covering P-top implantation region 222' and N-grade implantation region 224', a third FOX portion 233 covering a left edge portion of HVNW 205 between first P-well 210 and second P-well 215, and a fourth FOX portion 234 covering a left edge portion of second P-well 215.

FOX layer 230 can be formed by a deposition process that deposits a silicon nitride layer, a photolithography process that defines regions where FOX layer 230 is to be formed, an etching process that removes the silicon nitride layer in the defined regions, and a thermal oxidation process that forms FOX layer 230 in the defined regions. During the thermal oxidation process for forming FOX layer 230, the P-type dopant in P-top implantation region 222', the P-type dopant in P-type implantation region 225', and the N-type dopant in N-grade implantation region 224' are driven to predetermined depths in HVNW 205 to form P-top region 222, P-type deep implantation region 225, and N-grade region 224, respectively. The depth of P-top region 222 can be about 0.5 μm to 3 μm. The depth of N-grade region 224 can be about 0.1 μm to 1 μm. The width and depth of P-type deep implantation region 225, the doping concentration in P-type deep implantation region 225, the distance between P-type deep implantation region 225 and first P-well 210, and the distance between P-type deep implantation region 225 and P-top region 222 and N-grade region 224, are variables determined in view of various design considerations, such as the doping concentrations in P-top region 222, N-grade region 224, and HVNW 205, and the structure and/or application of LDMOS device 10.

Figure 8A:
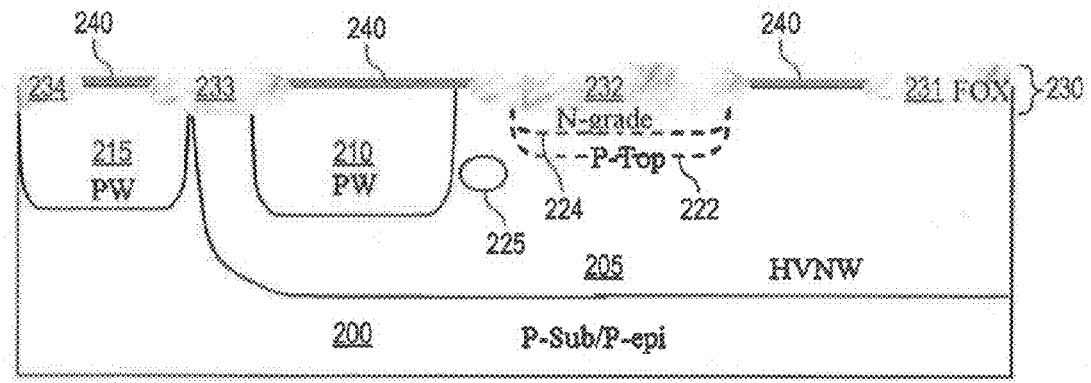
Figure 8B:
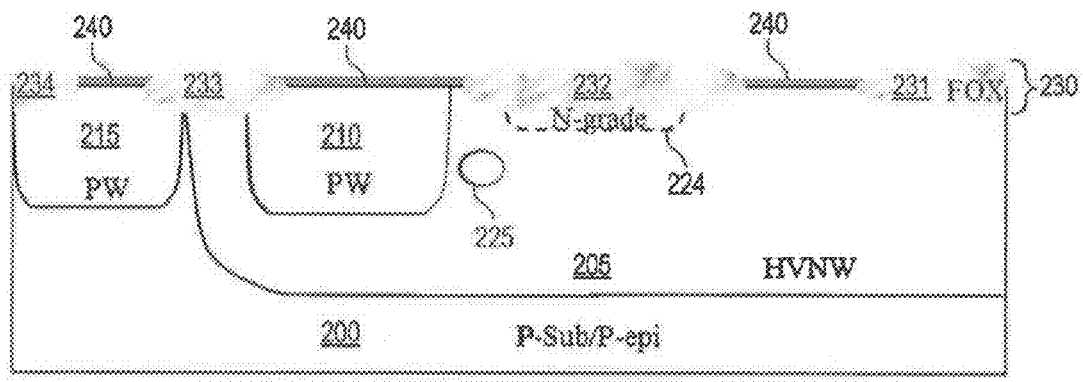

Referring to FIGS. 8A and 8B, a gate oxide layer 240 is formed on surface portions of the structure of FIGS. 7A and 7B that are not covered by FOX layer 230. That is, gate oxide layer 240 is formed between first FOX portion 231 and second FOX portion 232, between second FOX portion 232 and third FOX portion 233, and between third FOX portion 233 and fourth FOX portion 234. Gate oxide layer 240 can be formed by a sacrificial oxidation process to form a sacrificial oxide layer, a cleaning process to remove the sacrificial oxide layer, and an oxidation process to form gate oxide layer 240.

Figure 9A:
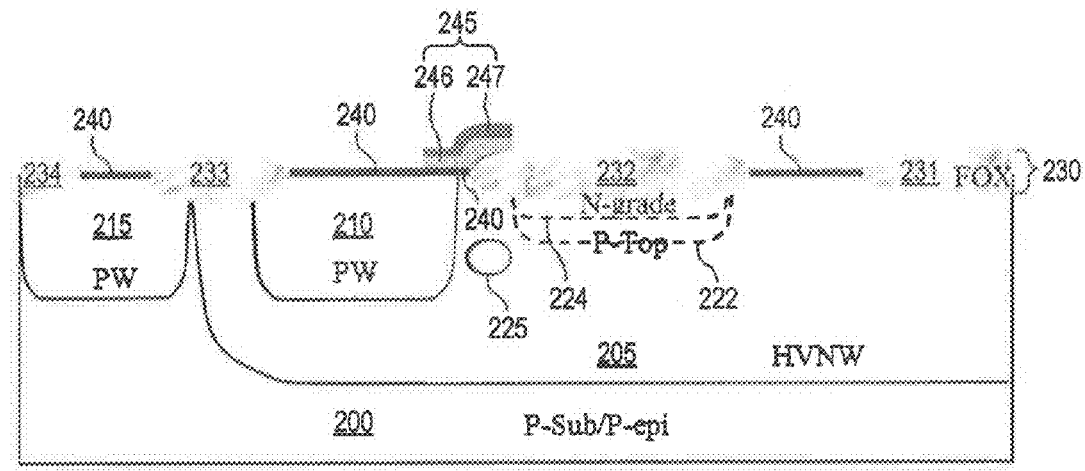
Figure 9B:
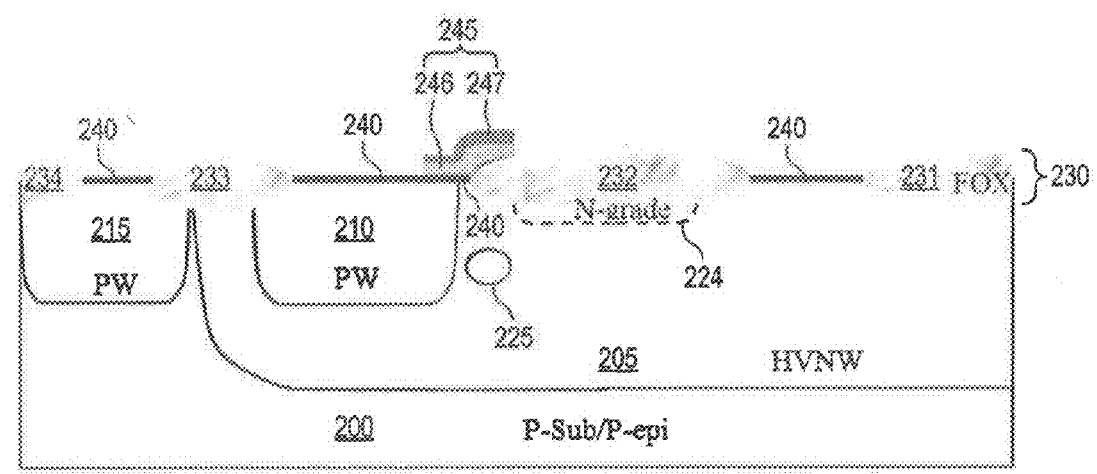

Referring to FIGS. 9A and 9B, a gate layer 245 is formed on gate oxide layer 240, overlying a left portion of second FOX portion 232 and a right portion of first FOX portion 210. Gate layer 245 can include a polysilicon layer 246 and a tungsten silicide layer 247 formed on polysilicon layer 246. The thickness of gate layer 245 can be about 0.1 μm to 0.7 μm. Gate layer 245 can be formed by a deposition process for depositing a polysilicon layer and a tungsten silicide layer over the entire substrate, a photolithography process that defines a region where gate layer 245 is to be formed, and an etching process that removes the polysilicon layer and the tungsten silicide layer outside the defined region.

Figure 10A:
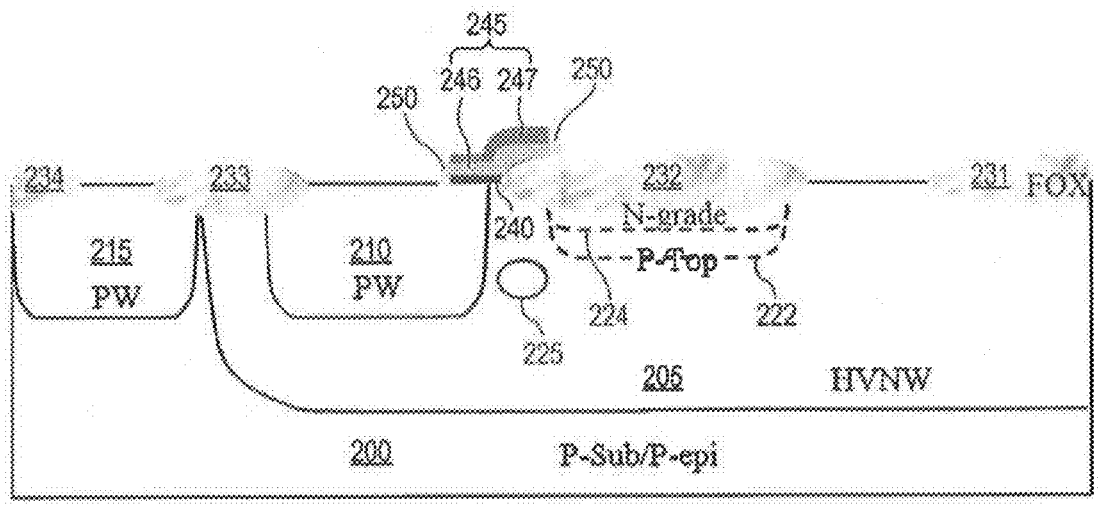
Figure 10B:
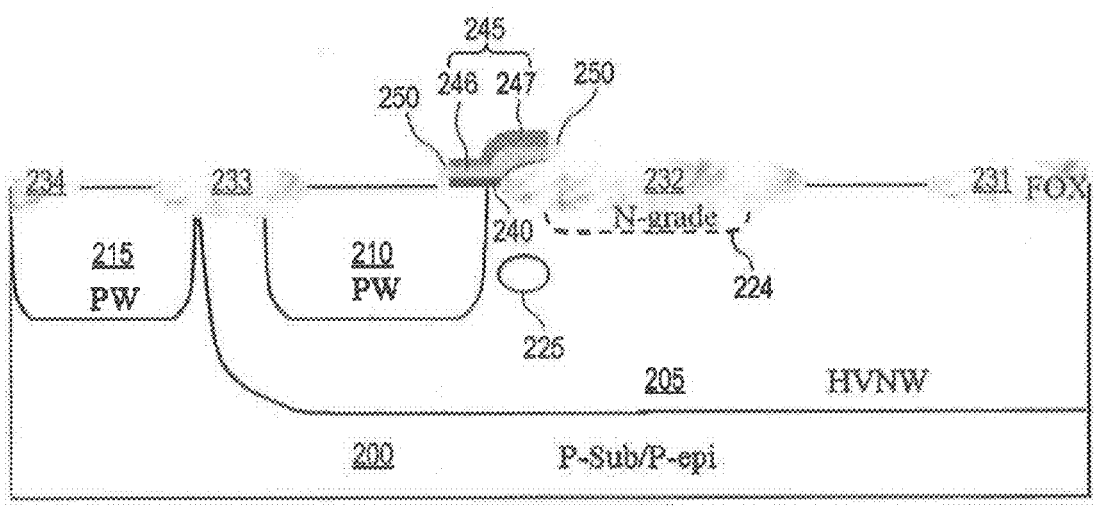

Referring to FIGS. 10A and 10B, spacers 250 are formed on both sides of gate layer 245. Spacers 250 can be tetraethoxysilane (TEOS) oxide films. Spacers 250 can be formed by a deposition process that deposits the TEOS oxide film, a photolithography process that defines regions where spacers 250 are to be formed, and an etching process that removes the TEOS oxide film outside the defined regions. After spacers 250 are formed, gate oxide layer 240, except for the portion under gate layer 245 and spacers 250, is removed by etching.

Figure 11A:
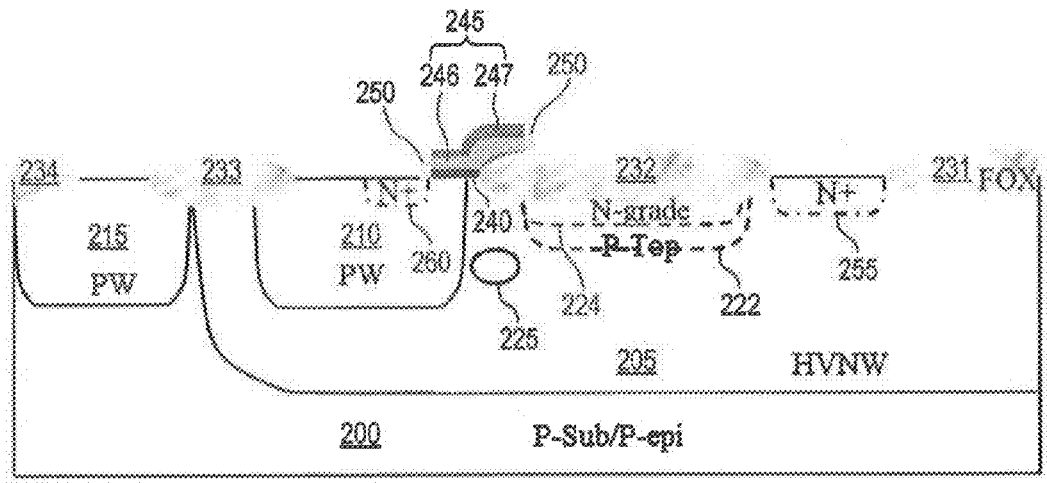
Figure 11B:
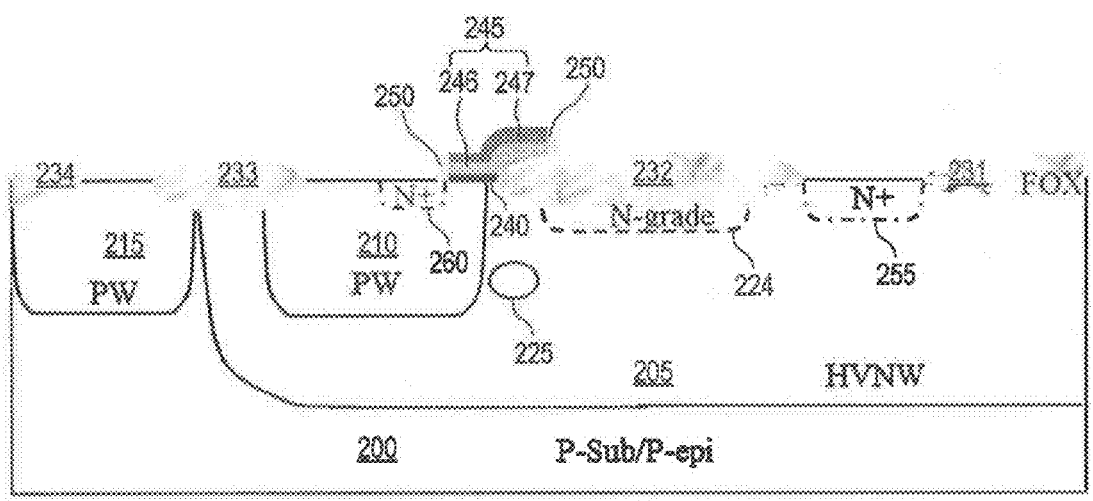

Referring to FIGS. 11A and 11B, a first N$^+$-region 255 is formed in HVNW 205 between first FOX portion 231 and second FOX portion 232, and a second N$^+$-region 260 is formed in first P-well 210 adjacent to a left edge portion of gate layer 245 and under a left-side spacer 250. First N$^+$-region 255 and second N$^+$-region 260 can be formed by a photolithography process that defines regions where first N+-region 255 and second N+-region 260 are to be formed, and an ion implantation process for implanting a N-type dopant (e.g., phosphorus or arsenic) at a concentration of about $10^{15}$ to $10^{16}$ atoms/cm$^2$ in the defined regions.

Figure 12A:
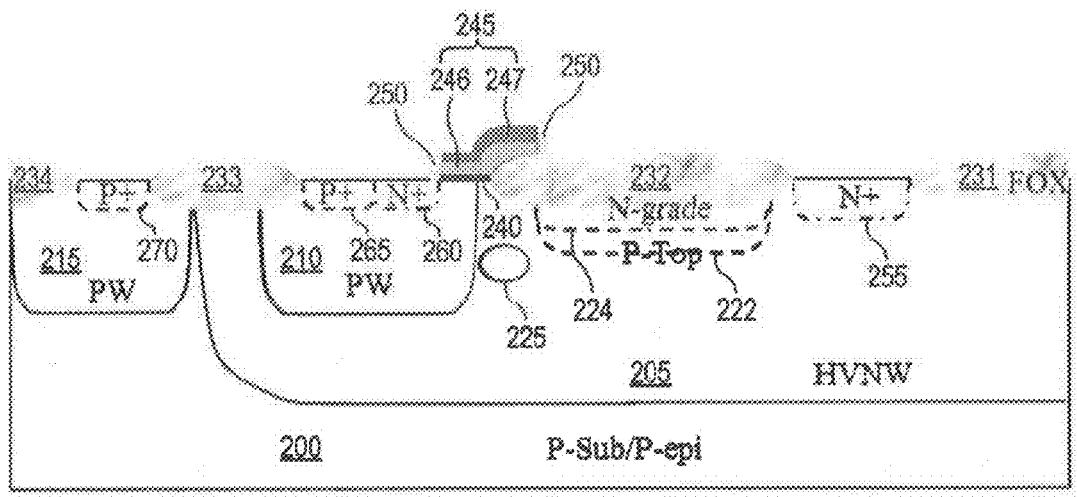
Figure 12B:
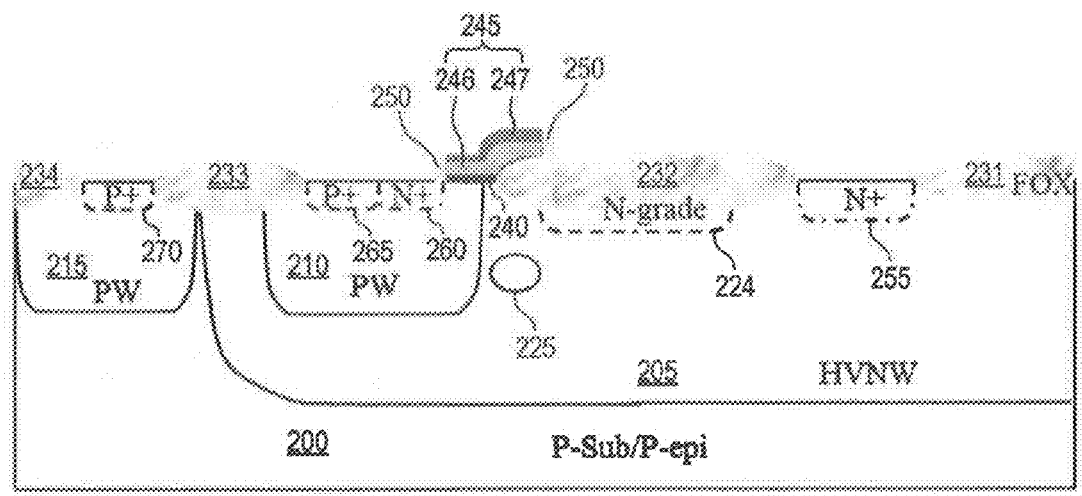

Referring to FIGS. 12A and 12B, a first P+-region 265 is formed in first P-well 210 adjacent to second N+-region 260, and a second P+-region 270 is formed in second P-well 215 between third FOX portion 233 and fourth FOX portion 234. First P+-region 265 and second P+-region 270 can be formed by a photolithography process that defines regions where first P+-region 265 and second P+-region 270 are to be formed, and an ion implantation process for implanting a P-type dopant (e.g., boron) at a concentration of about $10^{15}$ to $10^{16}$ atoms/cm$^2$ in the defined regions.

Figure 13A:
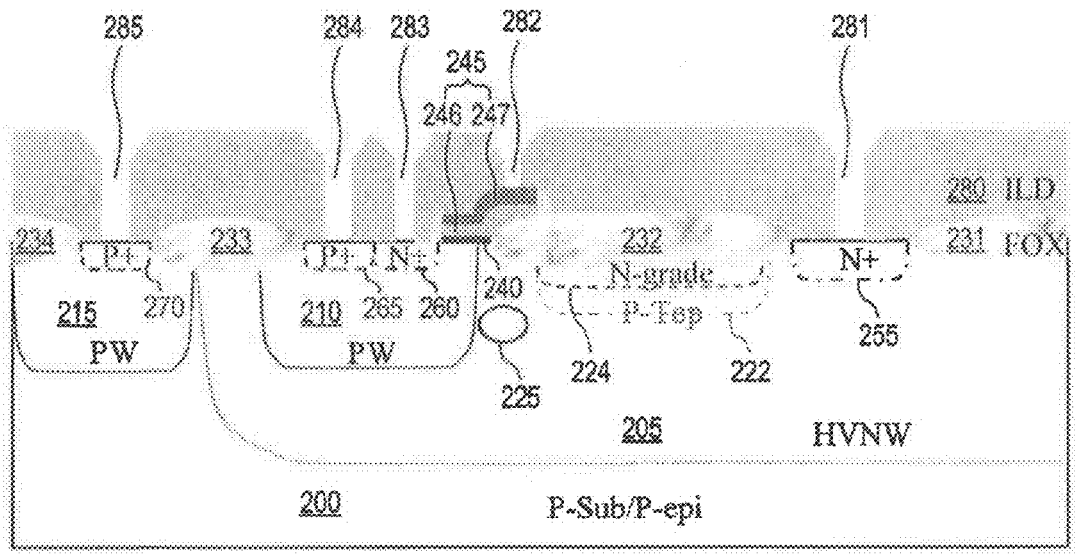
Figure 13B:
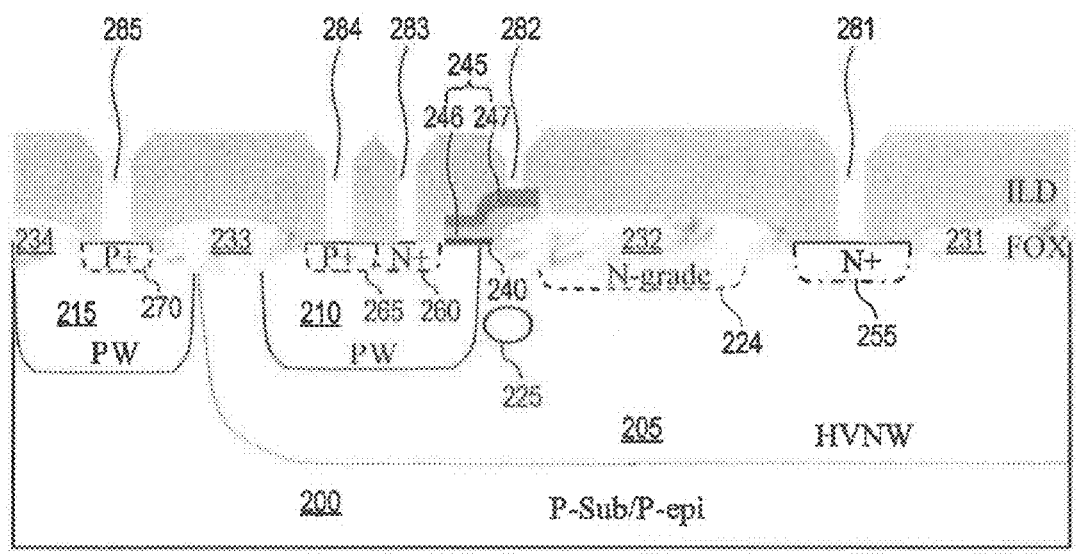

Referring to FIGS. 13A and 13B, an interlayer dielectric (ILD) layer 280 is formed on the entire surface of the structure of FIGS. 12A and 12B. ILD layer 280 includes a first opening 281 that is vertically aligned with first N+-region 255, a second opening 282 that is vertically aligned with gate layer 245, a third opening 283 that is vertically aligned with second N+-region 260, a fourth opening 284 that is vertically aligned with first P+-region 265, and a fifth opening 285 that is vertically aligned with second P+-region 270. ILD layer 280 can include undoped silicate glass (USG) and/or borophosphosilicate glass (BPSG). The thickness of ILD layer 280 can be 0.5 μm to 2 μm. ILD layer 280 can be formed by a deposition process for depositing a layer of USG and/or BPSG, a photolithography process that defines regions where ILD layer 280 is to be formed, and an etching process that removes the layer of USG and/or BPSG outside the defined regions for forming openings 281 through 285.

Figure 14A:
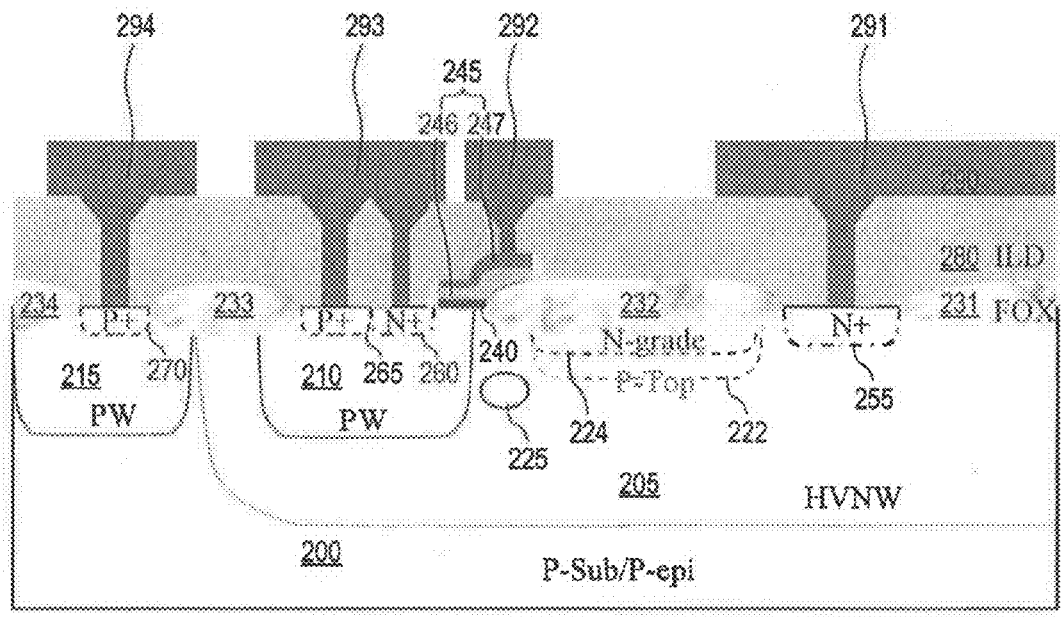
Figure 14B:
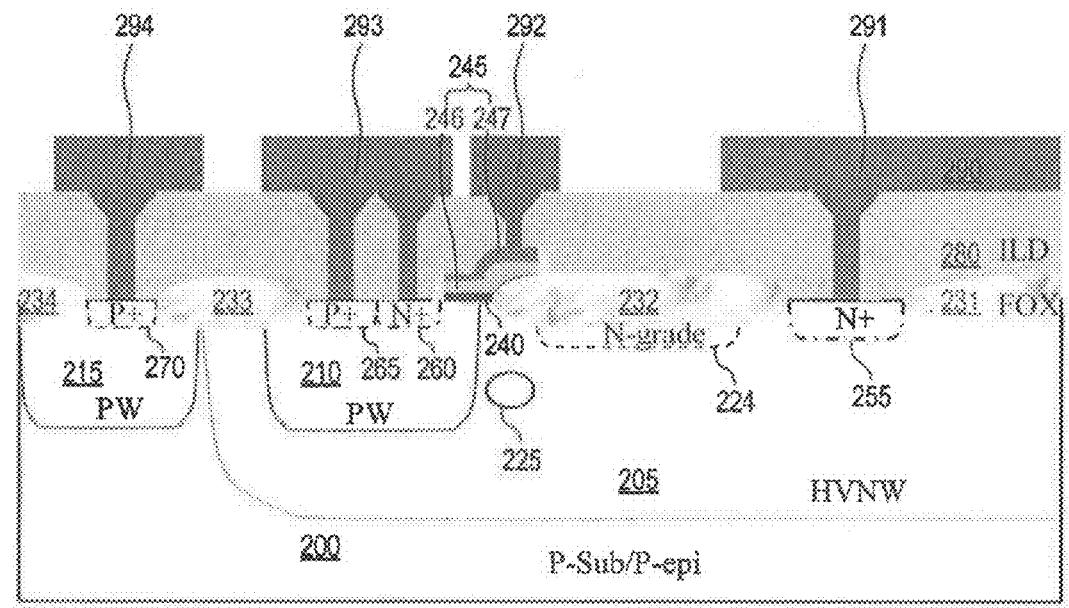

Referring to FIGS. 14A and 14B, a contact layer 290 is formed on the structure of FIGS. 13A and 13B. Contact layer 290 includes a first contact portion 291 that contacts first N+-region 255, a second contact portion 292 that contacts gate layer 245, a third contact portion 293 that contacts both second N+-region 260 and first P+-region 265, and a fourth contact portion 294 that contacts second P+-region 270. Contact layer 290 can be made of any electrically conductive metal, such as aluminum, copper, or an aluminum-copper alloy. Contact layer 290 can be formed by a deposition process that deposits a metal layer, a photolithography process that defines regions where contact layer 290 is to be formed, and an etching process that removes the metal layer outside the defined regions.

Figure 15:
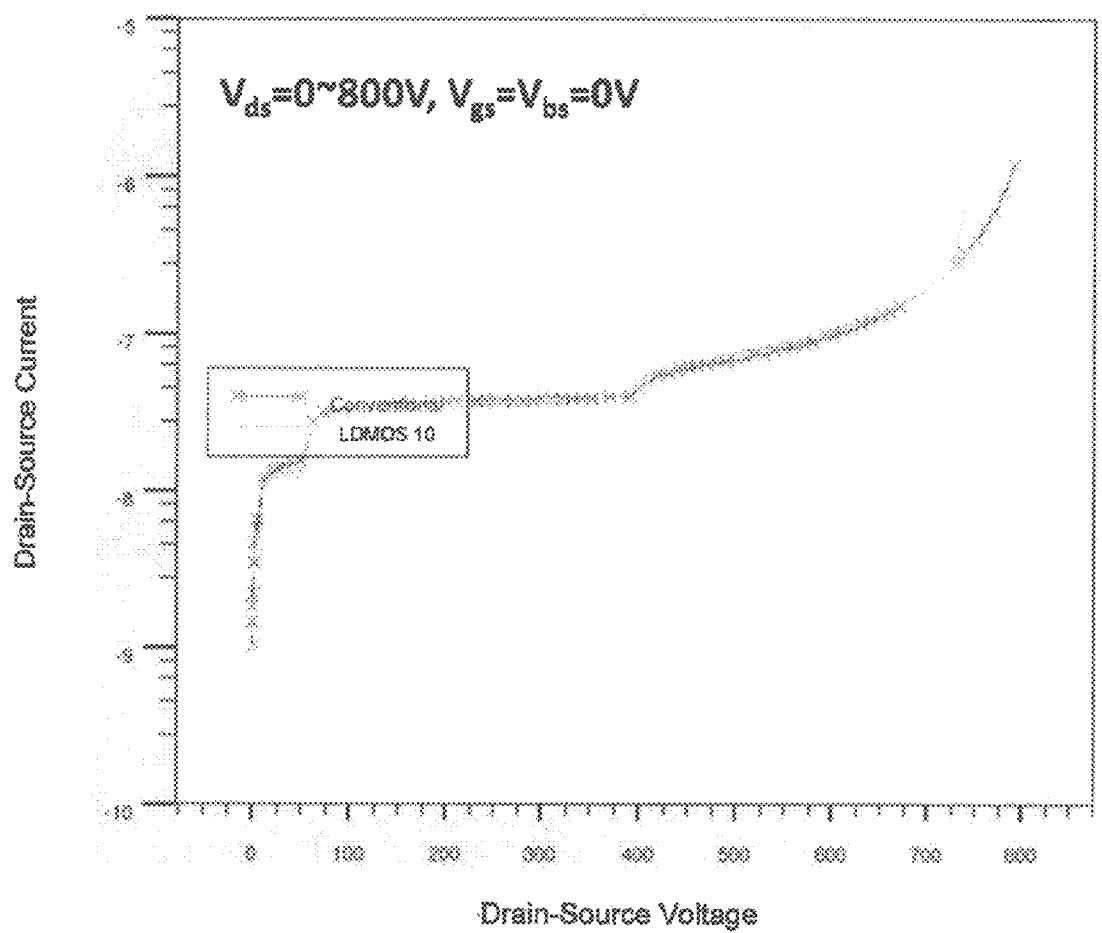
FIG. 15 is a graph showing drain characteristics of the LDMOS device of FIGS. 1A-1C, and a conventional device constructed as a comparative example.

FIG. 15 is a graph showing drain characteristics of LDMOS device 10 having P-type deep implantation region 125 as illustrated in FIGS. 1A-1C, and a conventional device constructed as a comparative example. The conventional device does not include P-type deep implantation region 125. In FIG. 15, a drain-source voltage $V_{DS}$ varies from 0 to 800V, and a gate-source voltage $V_{GS}$ and a bulk-source voltage $V_{BS}$ are maintained at 0V. As illustrated in FIG. 15, the off-breakdown voltage of both of LDMOS device 10 and the conventional device are above 700V. Therefore, LDMOS device 10 has approximately the same off-breakdown voltage as that of the conventional device.

Figure 16:
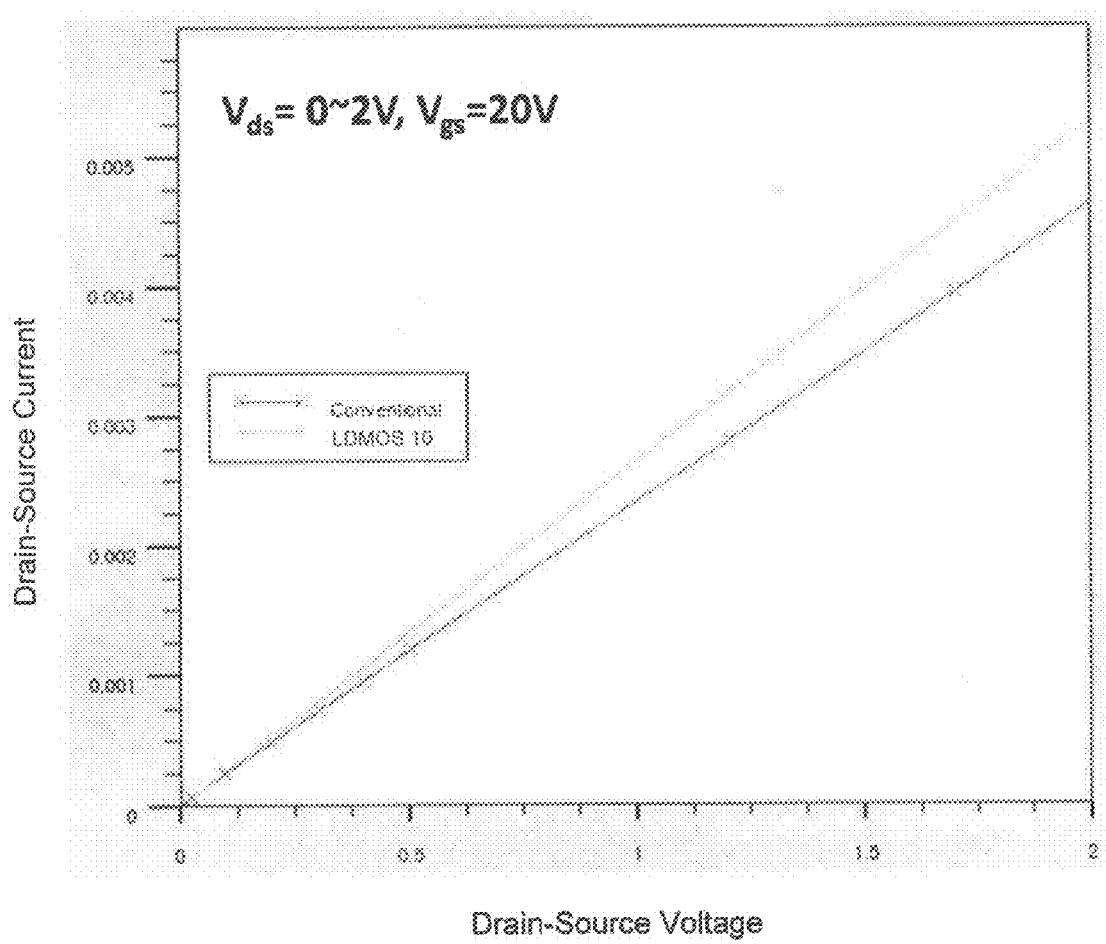
FIG. 16 is a graph showing drain characteristics of the LDMOS device of FIGS. 1A-1C, and a conventional device constructed as a comparative example.

FIG. 16 is a graph showing the drain characteristics of the LDMOS device 10 and the conventional device. In FIG. 16, $V_{DS}$ varies from 0 to 2V, and $V_{GS}$ is maintained at 20V. As illustrated in FIG. 16, for the same value of $V_{DS}$, a drain-source current $I_{DS}$ of LDMOS 10 is higher than that of the conventional device. Therefore, LDMOS 10 has a lower specific on-resistance than that of the conventional device, while having the same off-breakdown voltage as that of the conventional device.

While the embodiment described above is directed to N-type LDMOS device 10 shown in FIGS. 1A and 1B and fabrication methods thereof shown in FIGS. 2A-13B, those skilled in the art will now appreciate that the disclosed concepts are equally applicable to a P-type LDMOS devices. Those skilled in the art will also appreciate that the disclosed concepts are applicable to other semiconductor devices and the fabrication methods thereof, such as insulated-gate bipolar transistor (IGBT) devices and diodes.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A semiconductor device, comprising:
a substrate having a first conductivity type;
a high-voltage well having a second conductivity type and disposed in the substrate;
a source well having the first conductivity type and disposed in the high-voltage well;
a source region entirely disposed in the source well and having a doping concentration higher than a doping concentration of the source well;
a drift region disposed in the high-voltage well and spaced apart from the source well; and
a deep implantation region having the first conductivity type and disposed in the high-voltage well outside of the source well, and between the source well and the drift region,
wherein the drift region includes a plurality of alternately arranged first sections and second sections in a top view of the semiconductor device,
the drift region further including:
a top region having the first conductivity type only in the first sections in a cross-sectional view of the semiconductor device; and
a grade region having the second conductivity type in both of the first sections and the second sections in the cross-sectional view of the semiconductor device, the grade region being formed on top of the top region in each of the first sections.

2. The semiconductor device of claim 1, wherein
each first section of the drift region includes the top region having the first conductivity type and the grade region having the second conductivity type and formed on top of the top region, and
each second section only includes the grade region.

3. The semiconductor device of claim 1, wherein the first conductivity type is P-type and the second conductivity type is N-type.

4. The semiconductor device of claim 1, wherein the first conductivity type is N-type and the second conductivity type is P-type.

5. The semiconductor device of claim 1, wherein the source well is disposed close to an edge portion of the high-voltage well, and the device further includes a bulk well having the first conductivity type disposed outside the high-voltage well and adjacent to the edge portion of the high-voltage well.

6. The semiconductor device of claim 5, further including an insulation layer disposed on the substrate, the insulation layer including:
a first insulation portion spaced apart from the drift region;
a second insulation portion covering the drift region;
a third insulation portion covering the edge portion of the high-voltage well; and a fourth insulation portion covering an edge portion of the bulk well.

7. The semiconductor device of claim 6, further including:
a gate oxide layer disposed on the substrate between the source well and the second insulation portion; and
a gate layer disposed on the gate oxide layer.

8. The semiconductor device of claim 7, further including:
a drain region disposed in the high-voltage well and spaced apart from the drift region; and
a bulk region disposed in the bulk well.

9. The semiconductor device of claim 8, further including:
an interlayer dielectric layer disposed on the substrate; and
a contact layer disposed on the interlayer dielectric layer.

10. A method for fabricating a semiconductor device, the method comprising:
providing a substrate having a first conductivity type;
forming a high-voltage well having a second conductivity type in the substrate;
forming a source well having the first conductivity type in the high-voltage well;
forming a source region entirely in the source well and having a doping concentration higher than a doping concentration of the source well;
forming a drift region in the high-voltage well and spaced apart from the source well; and
forming a deep implantation region having the first conductivity type in the high-voltage well outside of the source well, and between the source well and the drift region,
wherein the drift region includes a plurality of alternately arranged first sections and second sections in a top view of the semiconductor device,
the forming of the drift region in the high-voltage well further including:
forming a top region having the first conductivity type only in the first sections in a cross-sectional view of the semiconductor device; and
forming a grade region having the second conductivity type in both of the first sections and the second sections in the cross-sectional view of the semiconductor device, the grade region being formed on top of the top region in each of the first sections.

11. The method of claim 10, wherein the first conductivity type is P-type and the second conductivity type is N-type.

12. The method of claim 10, wherein the first conductivity type is N-type and the second conductivity type is P-type.

13. The method of claim 10, wherein the source well is formed close to an edge portion of the high-voltage well, and the method further includes forming a bulk well having the first conductivity type outside and adjacent to the edge portion of the high-voltage well.

14. The method of claim 13, further including forming an insulation layer disposed on the substrate, including:
forming a first insulation portion spaced apart from the drift region;
forming a second insulation portion covering the drift region;
forming a third insulation portion covering the edge portion of the high-voltage well; and
forming a fourth insulation portion covering an edge portion of the bulk well.

15. The method of claim 14, further including:
forming a gate oxide layer on the substrate between the source well and the second insulation portion; and
forming a gate layer on the gate oxide layer.

16. The method of claim 15, further including:
forming a drain region in the high-voltage well and spaced apart from the drift region; and
forming a bulk region disposed in the bulk well.

17. The method of claim 16, further including:
forming an interlayer dielectric layer on the substrate; and
forming a contact layer on the interlayer dielectric layer.

* * * * *